United States Patent
Fu

(10) Patent No.: US 10,757,817 B2
(45) Date of Patent: Aug. 25, 2020

(54) PRINTED CIRCUIT BOARD WITH EMBEDDED COMPONENTS FOR ELECTRONIC DEVICE AND METHOD FOR MAKING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/248,316

(22) Filed: Jan. 15, 2019

(65) Prior Publication Data

US 2020/0163224 A1 May 21, 2020

(30) Foreign Application Priority Data

Nov. 20, 2018 (CN) .......................... 2018 1 1385406

(51) Int. Cl.
*H05K 3/30* (2006.01)
*H05K 1/18* (2006.01)
*H05K 3/32* (2006.01)
*H05K 3/00* (2006.01)
*H05K 3/06* (2006.01)

(52) U.S. Cl.
CPC ............. *H05K 3/301* (2013.01); *H05K 1/185* (2013.01); *H05K 1/189* (2013.01); *H05K 3/32* (2013.01); *H05K 3/0032* (2013.01); *H05K 3/0047* (2013.01); *H05K 3/06* (2013.01)

(58) Field of Classification Search
CPC ........ H05K 1/185; H05K 3/301; H05K 1/189; H05K 3/32; H05K 3/0032; H05K 3/0047; H05K 3/06
USPC ......................................................... 174/258
See application file for complete search history.

(56) References Cited

U.S. PATENT DOCUMENTS

| | | | |
|---|---|---|---|
| 2009/0075457 A1* | 3/2009 | Machida | H01L 23/3114 438/462 |
| 2019/0141836 A1* | 5/2019 | Gavagnin | H05K 3/4664 |

* cited by examiner

*Primary Examiner* — Tremesha S Willis
(74) *Attorney, Agent, or Firm* — ScienBiziP, P.C.

(57) ABSTRACT

A circuit board with embedded components includes an inner layer board, electronic component disposed in the inner layer circuit board, and third to sixth conductive circuit layers. The third and fourth conductive circuit layers are on opposite surfaces of the inner circuit board through first and second adhesive layers. The third conductive circuit layer and the fourth conductive circuit layer are electrically connected to the first conductive circuit layer and the second conductive circuit layer.

6 Claims, 3 Drawing Sheets

PRINTED CIRCUIT BOARD WITH EMBEDDED COMPONENTS FOR ELECTRONIC DEVICE AND METHOD FOR MAKING THE SAME

FIELD

The subject matter herein generally relates to printed circuit boards.

BACKGROUND

Electronic products usually include circuit boards and a volume of the electronic product must be large enough to contain the board. Electronic components (such as resistors, capacitors, etc.) can be embedded in inside of the circuit board to reduce a thickness of the circuit board, thereby reducing a thickness of the electronic product. Generally, a method of making embedded circuit board includes steps of making a multi-layer flexible board having no circuit, opening holes in a multi-layer flexible board, and applying glue. An electronic component is placed in the hole through the glue, then a circuit layer board is pressed on the multi-layer flexible board. The glue is peeled off and another circuit layer board is pressed down. The above method of making the embedded circuit board includes making the multi-layer flexible board before opening holes and the electronic component is attached to the glue to cause the component to deviate from the center line of the embedded circuit board. In opening blind holes, there is a problem about a thickness difference of the electronic component relative to the multi-layer flexible board. Residual glue left during this method can affect a reliability of the embedded circuit board.

BRIEF DESCRIPTION OF THE DRAWINGS

Implementations of the present technology will now be described, by way of example only, with reference to the attached figures.

DETAILED DESCRIPTION

Figure 1:
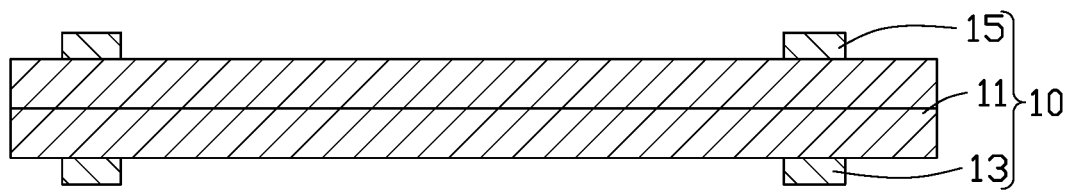
FIG. 1 is a diagram of an exemplary embodiment of an inner layer of a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIGS. 1 to 7 illustrate a method for making a circuit board 100 with an embedded electronic component 50 in accordance with a first exemplary embodiment. The method for making the circuit board 100 is provided by way of example, as there are a variety of ways to carry out the method. The exemplary method can begin at block 1.

At block 1 in FIG., an inner layer is provided and processed to obtain an inner layer circuit board 10. The inner layer circuit board 10 includes a flexible base layer 11, a first conductive circuit layer 13, and a second conductive circuit layer 15 electrically connected to the first conductive circuit layer 13. The first conductive circuit layer 13 and the second conductive circuit layer 15 are on opposite surfaces of the flexible base layer 11.

In at least one exemplary embodiment, the flexible base layer 11 is made of a material selected from polyimide (PI), liquid crystal polymer (LCP), polyetheretherketone (PEEK), polyethylene terephthalate (Polyethylene Terephthalate (PET) and Polyethylene Naphthalate (PEN).

The first conductive circuit layer 13 and the second conductive circuit layer 15 are formed by drilling, copper plating, etching, laminating, developing, and stripping (also as developing etching stripping, DES) on the copper layers formed on opposite surfaces of the flexible base layer 11.

Figure 2:
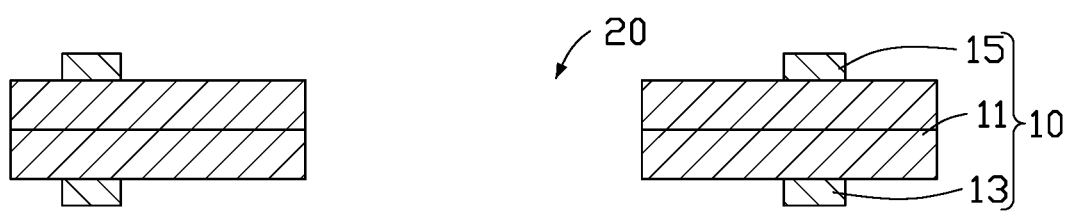
FIG. 2 is a diagram of the inner layer circuit board of FIG. 1 after an opening process is performed.

At block 2 in FIG. 2, a hole 20 is formed in the inner layer circuit board 10. The hole 20 extends through the inner layer circuit board 10.

A size of the hole 20 is greater than a size of the electronic component 50. In an embodiment, the hole 20 is formed by laser. In another embodiment, the hole 20 can be formed by other means, such as mechanical drilling or stamping.

Figure 3:
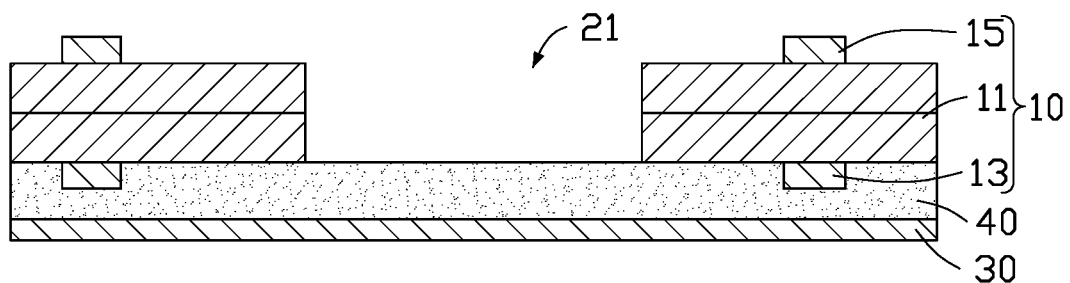
FIG. 3 is a diagram of the inner layer circuit board of FIG. 2 pressed with a first copper layer.

At block 3 in FIG. 3, a first copper layer 30 is provided and is pressed onto the first conductive circuit layer 13 using a first adhesive layer 40. The first adhesive layer 40 covers a bottom of the hole 20 to form a mounting groove 21.

In the embodiment, the first adhesive layer 40 is made of a high-viscosity resin which is still sticky after pressing. The first adhesive layer 40 can be made of a material selected from a group consisting of polypropylene, epoxy resin, polyurethane, phenolic resin, urea formaldehyde resin, melamine-formaldehyde resin, liquid crystal polymer, polyethylene terephthalate, polyether ether ketone, poly ethylene naphthalate and polyimide, and any combination thereof.

Figure 4:
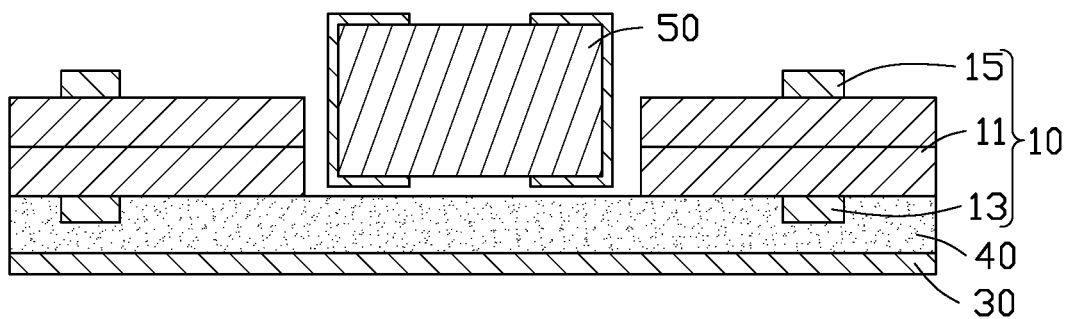
FIG. 4 is a diagram of a component received in a mounting groove in the inner layer circuit board of FIG. 3.

At block 4 in FIG. 4, the electronic component 50 is positioned in the mounting groove 21.

In the embodiment, the electronic component 50 is an integrated circuit chip. In another embodiment, the electronic component 50 can be other active or passive electronic component.

Figure 5:
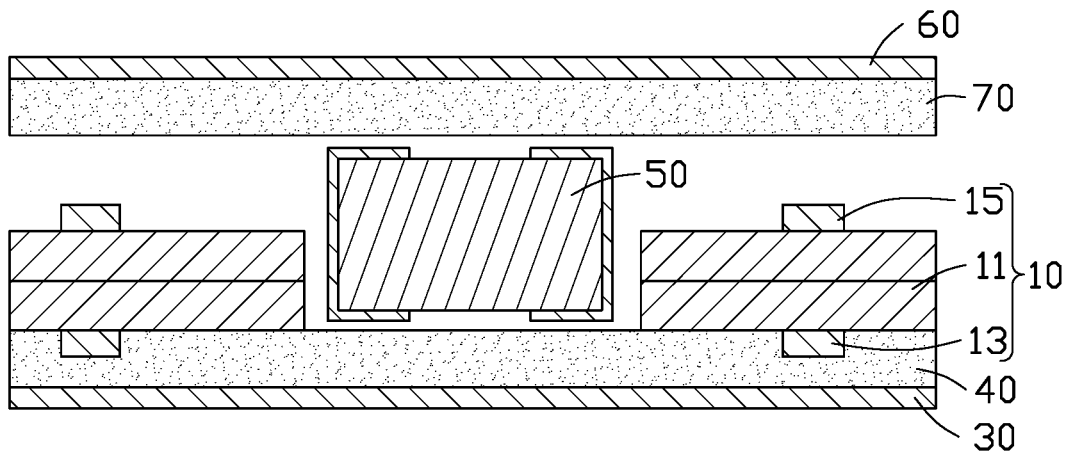
FIG. 5 is a diagram of the inner layer circuit board of FIG. 4 pressed with a second copper layer.

At block 5 in FIG. 5, a second copper layer 60 is provided and is attached to the second conductive circuit layer 15 through a second adhesive layer 70.

In the embodiment, the second adhesive layer 70 is made of a high-viscosity resin. The second adhesive layer 70 can be made of a material selected from a group consisting of polypropylene, epoxy resin, polyurethane, phenolic resin, urea formaldehyde resin, melamine-formaldehyde resin, liquid crystal polymer, polyethylene terephthalate, polyether ether ketone, poly ethylene naphthalate and polyimide, and any combination thereof.

Figure 6:
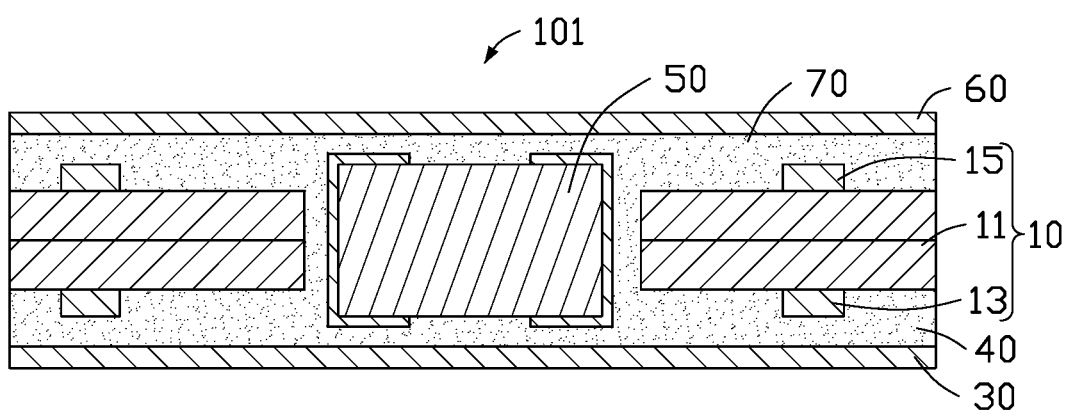
FIG. 6 is a diagram of the second copper layer, the inner layer circuit board, and the first copper layer of FIG. 5 pressed together to form a semi-finished embedded circuit board.

At block 6 in FIG. 6, the second copper layer 60, the inner layer circuit board 10 and the first copper layer 30 are pressed together to form a semi-finished embedded circuit board 101.

When pressed together, the first adhesive layer 40 and the second adhesive layer 70 fill a gap between the electronic component 50 and the mounting groove 21.

Figure 7:
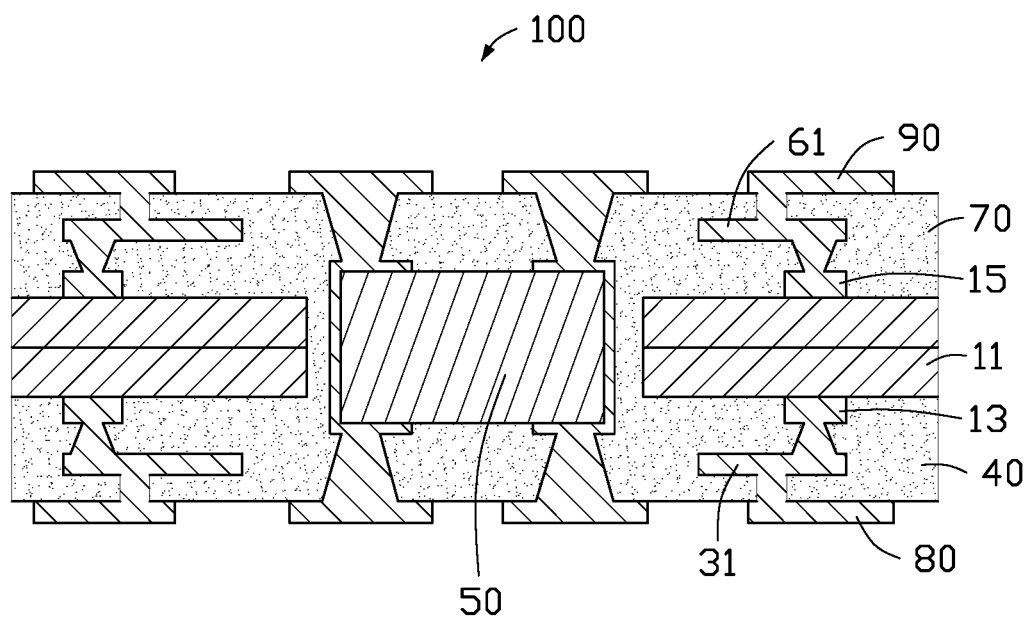
FIG. 7 is a diagram of the semi-finished embedded circuit board of FIG. 6 processed to obtain an embedded circuit board.

At block 7 in FIG. 7, the semi-finished embedded circuit board 101 is subjected to subsequent processing to obtain the circuit board 100 such that the embedded electronic component 50 is electrically connected to all circuit layers in the circuit board 100.

In the embodiment, the second copper layer 60, the inner layer circuit board 10, and the first copper layer 30 pressed together are achieved by drilling, copper plating, etching, laminating, developing, and stripping. The first copper layer 30 and the second copper layer 60 are etched to form a third conductive circuit layer 31 and a fourth conductive circuit layer 61. The third conductive circuit layer 31 and the fourth conductive circuit layer 61 are electrically connected respectively to the first conductive circuit layer 13 and the second conductive circuit layer 15. Two third adhesive layers (not shown) are pressed on copper layers on the outsides of the third conductive circuit layer 31 and the fourth conductive circuit layer 61, and are perforated by opening, plating, filling, etching, laminating, developing, and stripping to form a fifth conductive circuit layer 80 and a sixth conductive circuit layer 90. The fifth conductive circuit layer 80 and the sixth conductive circuit layer 90 are electrically connected to the electronic component 50, thereby obtaining the circuit board 100. The fifth conductive circuit layer 80 and the sixth conductive circuit layer 90 are electrically connected respectively to the third conductive circuit layer 31 and the fourth conductive circuit layer 61.

FIG. 7 illustrates an exemplary embodiment of the circuit board 100 with integrated circuit chip embedded therein. The circuit board 100 includes the inner layer circuit board 10, the electronic component 50 disposed in the inner layer circuit board 10, the third conductive circuit layer 31, the fourth conductive circuit 61, the fifth conductive circuit layer 80, and the sixth conductive circuit layer 90. The third conductive circuit layer 31 and the fourth conductive circuit layer 61 are attached to opposite surfaces of the inner circuit board 10 by means of the first adhesive layer 40 and the second adhesive layer 70. The fifth conductive circuit layer 80 and the sixth conductive circuit layer 90 are attached to the surfaces of the third conductive circuit layer 31 and the fourth conductive circuit layer 61 by means of the two third adhesive layers.

The inner layer circuit board 10 includes the flexible base layer 11, the first conductive circuit layer 13, and the second conductive circuit layer 15 electrically connected to the first conductive circuit layer 13. The first conductive circuit layer 13 and the second conductive circuit layer 15 are formed on opposite surfaces of the flexible base layer 11.

The first conductive circuit layer 13 and the second conductive circuit layer 15 are connected respectively to the third conductive circuit layer 31 and the fourth conductive circuit layer 61. The third conductive circuit layer 31 and the fourth conductive circuit layer 61 are connected respectively to the fifth conductive circuit layer 80 and the sixth conductive circuit layer 90.

The inner layer circuit board 10 defines at least one hole 20 extending straight down through the inner layer circuit board 10. The electronic component 50 is received in the hole 20 and is electrically connected to the fifth conductive circuit layer 80 and the sixth conductive circuit layer 90.

The hole 20 is formed in the inner layer circuit board 10. The first copper layer 30 is attached by being pressed to a first side of the inner layer circuit board 10 through a first adhesive layer 40. Then the electronic component 50 is received in the hole 20. The second copper layer 60 is attached by being pressed to opposing second side of the inner layer circuit board 10 through the second adhesive layer 70, to obtain the semi-finished circuit board 101. The electronic component 50 is closer to the centerline of the semi-finished circuit board 101. Thus when the semi-finished circuit board 101 is subjected to the opening process to obtain the circuit board 100, problems about different thicknesses of different electronic components 50 are avoided, and the number of layers for opening the hole 20 is reduced. The method of making the embedded circuit board 100 has no gluing processes which leave residual glue, and efficiency and reliability are improved.

In the embodiment, the circuit board 100 includes six circuit layers. In other embodiments, the circuit board 100 can include, but is not limited to, four or eight or more circuit layers. When the circuit board 100 includes four circuit layers, the electronic components 50 which are embedded are electrically connected to the third conductive circuit layer 31 and the fourth conductive circuit layer 61 by conductive blind holes.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for making an embedded circuit board comprising: providing an inner layer circuit board, the inner layer circuit board comprising a base layer, a first conductive circuit layer and a second conductive circuit layer positioned opposite surfaces of the base layer; forming a hole in the inner layer circuit board; providing a first copper layer and pressing the first copper layer onto the first conductive circuit layer using a first adhesive layer to cover a bottom of the hole to form a mounting groove; positioning an electronic component in the mounting groove; providing a second copper layer and connecting the second copper layer to the second conductive circuit layer using a second adhesive layer; pressing the second copper layer, the inner layer circuit board and the first copper layer together to fill a gap between the electronic component and the mounting groove with the first adhesive layer and the second adhesive layer to form a semi-finished embedded circuit board, wherein the electronic component is closer to the centerline of the semi-finished circuit board; and making the first copper layer to form a third conductive circuit layer connected to the first conductive circuit layer, and making the second copper layer to form a fourth conductive circuit layer connected to the second conductive circuit layer.

2. The method of claim 1, further comprises:
   forming a fifth conductive circuit layer on the third conductive circuit layer; and
   forming a sixth conductive circuit layer on the fourth conductive circuit layer.

3. The method of claim 2, wherein the fifth conductive circuit layer and the sixth conductive circuit layer are attached to the surfaces of the third conductive circuit layer and the fourth conductive circuit layer, the fifth conductive circuit layer is connected to the third conductive circuit layer and the electronic component, the sixth conductive circuit layer is connected to the fourth conductive circuit layer and the electronic component.

4. The method of claim 1, wherein the hole is formed by laser or mechanical drilling.

5. The method of claim 1, wherein the first adhesive layer is made of a high-viscosity resin and is still sticky after pressing.

6. The method of claim 1, wherein the first adhesive layer is made of a material selected from a group consisting of polypropylene, epoxy resin, polyurethane, phenolic resin, urea formaldehyde resin, melamine-formaldehyde resin, liquid crystal polymer, polyethylene terephthalate, polyether ether ketone, poly ethylene naphthalate and polyimide.

* * * * *